(12) United States Patent
Burnett et al.

(10) Patent No.: US 10,541,024 B2
(45) Date of Patent: Jan. 21, 2020

(54) MEMORY SYSTEM WITH SIGNALS ON READ LINES NOT PHASE-ALIGNED WITH JOSEPHSON TRANSMISSION LINE (JTL) ELEMENTS INCLUDED IN THE WRITE LINES

(71) Applicant: Microsoft Technology Licensing, LLC, Redmond, WA (US)

(72) Inventors: Randall M. Burnett, Catonsville, MD (US); Randal L. Posey, Baltimore, MD (US); Haitao O. Dai, Bluebell, PA (US); Quentin P. Herr, Ellicott City, MD (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 15/990,099

(22) Filed: May 25, 2018

(65) Prior Publication Data
US 2019/0362780 A1 Nov. 28, 2019

(51) Int. Cl.
*G11C 11/44* (2006.01)
*H01L 39/22* (2006.01)
*H01L 39/02* (2006.01)
*H01L 39/12* (2006.01)

(52) U.S. Cl.
CPC ............ *G11C 11/44* (2013.01); *H01L 39/025* (2013.01); *H01L 39/223* (2013.01); *H01L 39/12* (2013.01)

(58) Field of Classification Search
CPC ....... G11C 11/44; G11C 11/48; H01L 39/025; H01L 39/223; H01L 39/12
See application file for complete search history.

(56) References Cited

U.S. PATENT DOCUMENTS

| | | | |
|---|---|---|---|
| 6,078,517 A | 6/2000 | Herr et al. | |
| 7,724,020 B2 | 5/2010 | Herr et al. | |
| 7,786,748 B1 | 8/2010 | Herr et al. | |
| 8,755,220 B2 | 6/2014 | Bulzacchelli et al. | |
| 9,443,576 B1 | 9/2016 | Miller et al. | |
| 9,520,180 B1 | 12/2016 | Mukhanov et al. | |

(Continued)

FOREIGN PATENT DOCUMENTS

WO 2016007136 A1 1/2016

OTHER PUBLICATIONS

Dayton, et al., "Experimental Demonstration of a Josephson Magnetic Memory Cell with a Programmable π-Junction", In Journal of the Computing Research Repository, Nov. 6, 2017, pp. 1-5.

(Continued)

*Primary Examiner* — David Lam
(74) *Attorney, Agent, or Firm* — Ranjeev Singh; Singh Law, PLLC

(57) ABSTRACT

Current-based superconductor memory cell and related systems and methods are provided. A method in a memory system, having at least one storage circuit and at least one read SQUID, includes applying bit-line current, via a read bit-line not including any Josephson transmission line (JTL) elements, to the at least one read SQUID. The method further includes applying word-line current, via a read word-line not including any JTL elements, to the at least one read SQUID. The method further includes using the at least one read SQUID reading a logic state of the memory cell based on data maintained in the storage circuit.

18 Claims, 6 Drawing Sheets

(56) References Cited

U.S. PATENT DOCUMENTS

| | | | | |
|---|---|---|---|---|
| 9,520,181 | B1 * | 12/2016 | Miller | G11C 11/44 |
| 9,613,699 | B1 | 4/2017 | Reohr et al. | |
| 9,779,803 | B1 * | 10/2017 | Konigsburg | G11C 11/44 |
| 9,812,192 | B1 | 11/2017 | Burnett et al. | |
| 2018/0025775 | A1 | 1/2018 | Ambrose et al. | |

OTHER PUBLICATIONS

Dorojevets, et al., "Fast Pipelined Storage for High-Performance Energy-Efficient Computing with Superconductor Technology", In Proceedings of 12th International Conference & Expo on Emerging Technologies for a Smarter World, Oct. 2015, 7 Pages.

"International Search Report and Written Opinion Issued in PCT Application No. PCT/US2019/031929", dated Sep. 17, 2019, 11 Pages.

* cited by examiner

MEMORY SYSTEM WITH SIGNALS ON READ LINES NOT PHASE-ALIGNED WITH JOSEPHSON TRANSMISSION LINE (JTL) ELEMENTS INCLUDED IN THE WRITE LINES

BACKGROUND

Semiconductor based integrated circuits used in electronic devices, such as random access memories, include digital circuits based on complimentary metal-oxide semiconductor (CMOS) technology. CMOS technology, however, is reaching its limits in terms of the device size. In addition, leakage current in CMOS based memories is causing high power consumption even when these memories are not being accessed.

As an example, servers in a data center are increasingly consuming large amounts of power. The consumption of power is partly the result of power loss from the dissipation of energy even when the CMOS circuits are inactive. This is because even when such circuits, such as random-access memories, are inactive and are not consuming any dynamic power, they still consume power because of the need to maintain the state of CMOS transistors. In addition, because CMOS circuits are powered using DC voltage, there is a certain amount of current leakage even when the CMOS circuits are inactive. Thus, even when such circuits are not processing operations, such as read/write, power is wasted not only as a result of the requirement to maintain the state of the CMOS transistors, but also as a result of the current leakage.

An alternative approach to CMOS technology-based memory is a superconducting logic-based memory.

SUMMARY

In one example, the present disclosure relates to a memory system comprising an array of memory cells arranged in rows and columns. The memory system may further include a set of read word-lines coupled to a plurality of memory cells in the array of the memory cells, where each of the set of the read word-lines comprises a line not including any Josephson transmission line (JTL) elements. The memory system may further include a set of write word-lines coupled to the plurality of memory cells in the array of memory cells, where each of the set of the write word-lines comprises a line including at least one Josephson transmission line (JTL) element. Each of the memory cell may include at least one storage circuit and at least one read superconducting quantum interference device (SQUID), where the at least one storage circuit is configured to maintain a state of the memory cell, and where the at least one read SQUID is configured to read the state of the memory cell in response to an application of word-line current provided via a read word-line corresponding to the set of read word-lines.

In another aspect, a method in a memory system including at least one storage circuit and at least one read SQUID is provided. The method may include applying bit-line current, via a read bit-line not including any Josephson transmission line (JTL) elements, to the at least one read SQUID. The method may further include applying word-line current, via a read word-line not including any JTL elements, to the at least one read SQUID. The method may further include using the at least one read SQUID reading a logic state of the memory cell based on data maintained in the storage circuit.

In yet another aspect, the present disclosure relates to a memory system including an array of memory cells arranged in rows and columns. The memory system may further include a set of read word-lines coupled to a plurality of memory cells in the array of the memory cells, where each of the set of the read word-lines comprises a line not including any Josephson transmission line (JTL) elements. The memory system may further include a set of write word-lines coupled to the first plurality of memory cells in the array of memory cells, where each of the set of the write word-lines comprises a line including at least one Josephson transmission line (JTL) element. Each of the memory cell may include at least one differential flip-flop (DFF) and at least one read superconducting quantum interference device (SQUID), where the at least one read SQUID is configured to read the data stored in the at least one DFF in response to an application of word-line current via one of the set of read word-lines.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

BRIEF DESCRIPTION OF THE DRAWINGS

The present disclosure is illustrated by way of example and is not limited by the accompanying figures, in which like references indicate similar elements. Elements in the figures are illustrated for simplicity and clarity and have not necessarily been drawn to scale.

DETAILED DESCRIPTION

Figure 1:
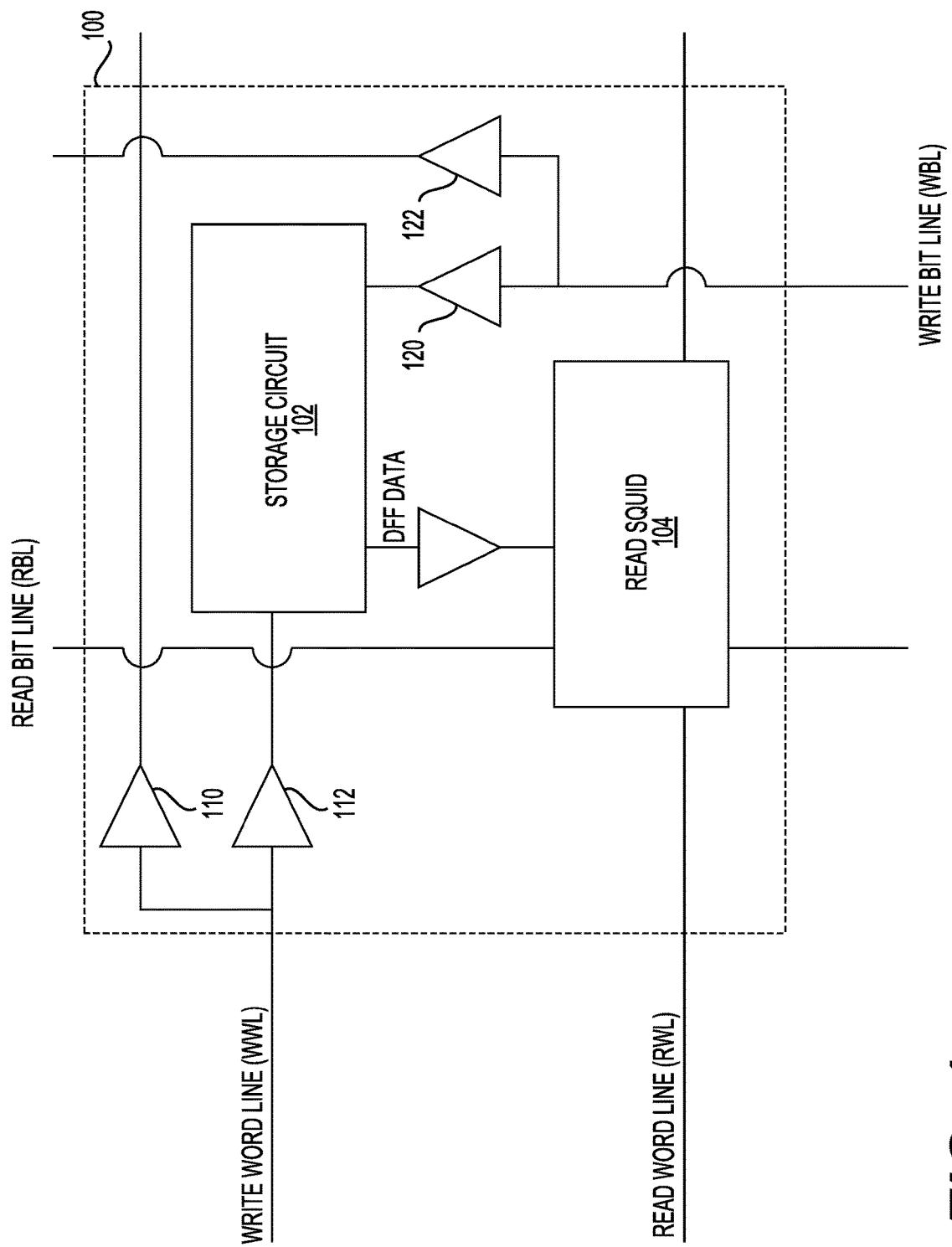
FIG. 1 shows a block diagram of a memory cell in accordance with one example.

Examples described in this disclosure relate to superconducting logic based memory systems, including current-based superconductor memory systems and memory cells. Certain examples relate to a memory cell that includes a storage circuit implemented by a differential flip-flop (DFF) and a read superconducting quantum interference device (SQUID). The memory cell is coupled to a read word line and a read bit line that do not use a Josephson transmission line (JTL) to couple signals to the memory cell. This may advantageously speed up the memory cell read operation. The memory cell may be implemented using any single flux quantum (SFQ) compatible logic. One example of such logic is the reciprocal quantum logic (RQL). Thus, certain examples further relate to reciprocal quantum logic (RQL) compatible memory cells. Unlike CMOS transistors, the RQL circuits are superconductor circuits that use Josephson junction based devices. An exemplary Josephson junction may include two superconductors coupled via a region that impedes current. The region that impedes current may be a physical narrowing of the superconductor itself, a metal region, or a thin insulating barrier. As an example, the Superconductor-Insulator-Superconductor (SIS) type of Josephson junctions may be implemented as part of the RQL circuits. As an example, superconductors are materials that can carry a direct electrical current (DC) in the absence of an electric field. Such materials have zero resistance. As an example, at temperatures below Tc (e.g., 9.3 K), niobium is superconductive; however, at temperatures above Tc, it behaves as a normal metal with electrical resistance. Thus, in the SIS type of Josephson junctions, superconductors may be Niobium superconductors and insulators may be $Al_2O_3$ barriers. In SIS type junctions, the superconducting electrons are described by a quantum mechanical wave-function. A changing phase difference in time of the phase of the superconducting electron wave-function between the two superconductors corresponds to a potential difference between the two superconductors. In RQL circuits, in one example, the SIS type junction may be part of a superconducting loop. When the potential difference between the two superconductors is integrated with respect to time over one cycle of phase change, the magnetic flux through the loop changes by an integer multiple of a single quantum of magnetic flux. The voltage pulse associated with the single quantum of magnetic flux is referred to as a single-flux-quantum (SFQ) pulse. As an example, overdamped Josephson junctions can create individual single-flux-quantum (SFQ) pulses. In RQL circuits, each Josephson junction may be part of one or more superconducting loops. The phase difference across the junction may be modulated by the magnetic flux applied to the loop.

Various RQL circuits, including transmission lines, can be formed by coupling multiple Josephson junctions by inductors or other components, as needed. SFQ pulses can travel via these transmission lines under the control of at least one clock. The SFQ pulses can be positive or negative. As an example, when a sinusoidal bias current is supplied to a junction, then both positive and negative pulses can travel rightward, during opposite clock phases, on a transmission line. The RQL circuits may advantageously have zero static power dissipation because of the absence of bias resistors. In addition, the RQL circuits may be powered using alternating current (AC) power. The AC power supply may also act as a stable clock reference signal for the RQL circuits. In one example, the digital data may be encoded using a pair of positive and negative (reciprocal) SFQ pulses. As an example, a logical one bit may be encoded as a reciprocal pair of SFQ pulses generated in the positive and negative phases of a sinusoidal clock. A logical zero bit may be encoded by the absence of positive/negative pulse pairs during a clock cycle. The positive SFQ pulse may arrive during the positive part of the clock, whereas the negative pulse may arrive during the negative part of the clock.

The building blocks of exemplary RQL circuits may include various types of logic gates. Exemplary logic gates include an AND gate, an OR gate, a logical A-and-not-B (AanB) gate, and a logical AND & OR (AndOr) gate. The AanB gate may have two inputs and one output (Q). An input pulse A may propagate to output Q unless an input pulse B comes first. The AndOr gate may have two inputs and two outputs (Q1 and Q2). The first input pulse, input pulse A or input pulse B, goes to output Q1 and the second input pulse goes to output Q2. The logical behavior of these gates may be based on the reciprocal data encoding mentioned earlier. As an example, a positive pulse changes the internal flux state of the inductive loop, but the trailing negative pulse erases the internal state every clock cycle, which in turn produces combinational logic behavior.

Microwave signals (e.g., SFQ pulses) may be used to control the state of a memory cell. During read/write operations, word-lines and bit-lines may be selectively activated by SFQ pulses arriving via an address bus. These pulses may, in turn, control word-line and bit-line drivers that may provide word-line and bit-line currents to the relevant memory cells. As an example, such a memory cell may be read out using a superconducting quantum interference device (SQUID). The memory cell may include a SQUID and a storage element, which may be configured such that under the application of appropriate amounts of current bias and magnetic flux, the memory cell may be in a logic '1' state or in a logic '0' state. In one example, if the memory cell is in the logic '1' state, under the application of a current via a word-line, the SQUID may transition into a "voltage state." A sense amplifier coupled to the memory cell may sense the voltage as being representative of the logic '1' state. The logic '0' state may correspond to a "substantially zero-voltage state," such that in the logic '0' state, despite the application of a current via a word-line, the SQUID may stay in the "substantially zero-voltage state." The sense amplifier may sense this as being representative of the logic '0' state.

Memory cells may be arranged in rows and columns, such that each row can be activated by a common flux bias (e.g., a read word-line signal) and each bit-line may form a transmission line that may propagate the output of the memory cells in a voltage state to a sense amplifier at one end of the column. Memory cells in a column may be serially biased by a common current source; for example, a flux pump.

FIG. 1 shows a block diagram of a memory cell 100 in accordance with one example. Memory cell 100 may include a storage circuit 102 and a read superconducting quantum interference device (SQUID) 104. Storage circuit 102 may act as a storage element corresponding to memory cell 100. In this example, storage circuit 102 may be implemented as a differential flip-flop (DFF). In one example, the DFF may be compatible with RQL logic. In another example, the DFF may be compatible with quantum flux parametron (QFP) logic. Memory cell 100 may be coupled to a write word line (WWL) and write bit line (WBL). Memory cell 100 may further be coupled to a read word line (RWL) and a read bit line (RBL). In this example, WWL is coupled via a Josephson transmission line (JTL) element 112 to storage circuit 102. WWL is further coupled via another JTL element 110 to the next memory cell in the row of memory cells. WBL is coupled via a JTL element 120 to storage circuit 102. WBL is further coupled via another JTL element 122 to the next memory cell in the column of memory cells. RWL is coupled as a transmission line to read SQUID 104. Similarly, RBL is coupled as a transmission line to read SQUID 104. Notably, in this example, neither RWL nor RBL is coupled via a JTL element. The transmission line coupling allows read operations to be performed at a faster speed than would be possible otherwise. Although FIG. 1 shows a certain number of components of memory cell 100 arranged in a certain manner, there could be more or fewer number of components arranged differently.

In terms of the operation of memory cell 100, when the RWL line becomes active additional current is added to the current from storage circuit 102. If the state of memory cell 100 is a logic "1," the sum of the two currents provides enough current to put read SQUID 104 into a voltage state and a read pulse is transmitted via the RBL. The read pulse can be detected by a circuit, such as a sense amplifier. Alternatively, if the state of memory cell 100 is a logic "0,"

despite the RWL line being active, the read SQUID stays in a state such that no pulse is sent out of memory cell 100. In this example, the logic '1' state may correspond to a "voltage state," in which a sense amplifier coupled to memory cell 100 may sense the current as being representative of the logic '1' state. The logic '0' state may correspond to a "substantially zero-voltage state," such that the sense amplifier may sense this as being representative of the logic '0' state.

Figure 2:
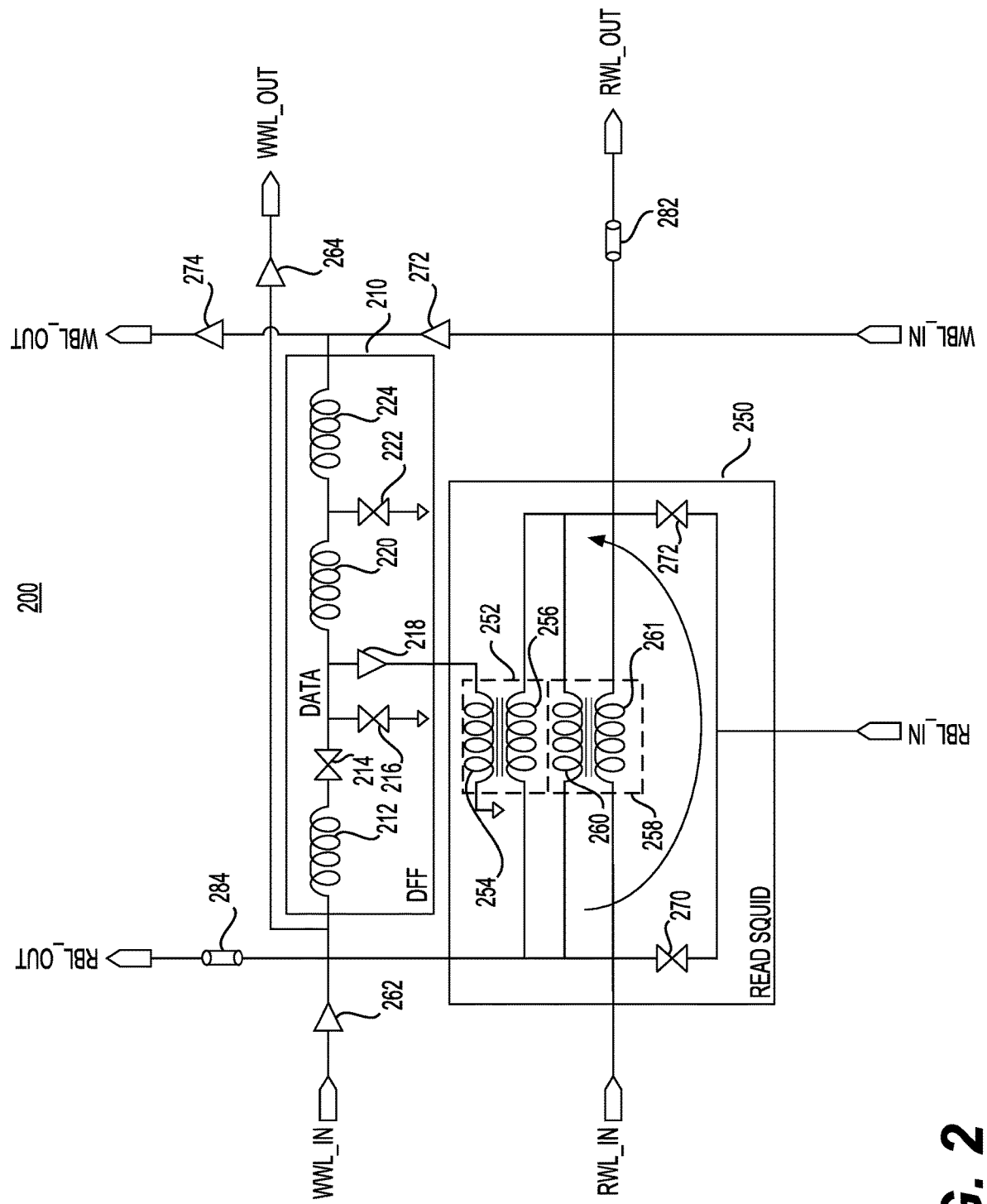
FIG. 2 shows a circuit diagram of a memory cell in accordance with one example.

FIG. 2 shows a memory circuit 200 of a memory cell 100 in accordance with one example. In this example, memory circuit 200 may include a differential flip-flop (DFF) 210 and a read SQUID 250. In one example, the DFF may be compatible with RQL logic. In another example, the DFF may be compatible with quantum flux parametron (QFP) logic. Memory circuit 200 may be coupled to a write word line (WWL) and write bit line (WBL). The WWL signals may be received via the terminal labeled WWL_IN. The WWL signals may be output via the terminal labeled WWL_OUT. The WBL signals may be received via the terminal labeled WBL_IN and they may be output via the terminal labeled WBL_OUT. Memory circuit 200 may further be coupled to a read word line (RWL) and a read bit line (RBL). The RWL signals may be received via the terminal labeled RWL_IN. The RWL signals may be output via the terminal labeled RWL_OUT. The RBL signals may be received via the terminal labeled RBL_IN and they may be output via the terminal labeled RBL_OUT. In this example, DFF 210 is coupled to the WWL_IN terminal via a Josephson transmission line (JTL) element 262 and DFF 210 is coupled to the WWL_OUT terminal via a JTL element 264. In addition, in this example, DFF 210 is coupled to the WBL_IN terminal via JTL element 276 and DFF 210 is coupled to the WBL_OUT terminal via a JTL element 278. Read SQUID 250 is coupled to the RWL via the RWL_IN terminal and the RWL_OUT terminal. Read SQUID 250 is coupled to the RBL via the RBL_IN terminal and the RBL_OUT terminal. Notably, in this example, neither RWL nor RBL is coupled via a JTL element to read SQUID 250. The transmission line couplings (e.g., transmission line 282 and transmission line 284) allow read operations to be performed at a faster speed than would be possible otherwise. This is because by not including the JTL elements, the signals on the transmission lines need not be phase-aligned with respect to the JTL elements being clocked by a resonator clock. Conversely, pulses travel on the transmission lines at the speed of light in this medium. Notably, in this example, while transmission lines 284 and 282 are shown as discrete elements, they are designed to incorporate the inductances and capacitances of the devices (e.g. transformers and Josephson junctions) that they are in series with, so that the entire path acts as a single transmission line.

With continued reference to FIG. 2, DFF 210 may include an inductor 212, a Josephson junction (JJ) 214, and a Josephson junction (JJ) 216. JJ 214 may be coupled to one end of inductor 212 and an output of JTL element 272 may be coupled to the other end of inductor 212. Another inductor 220 may be coupled between JJ 216 and another Josephson junction (JJ) 222. One end of each of JJ 216 and JJ 222 may be coupled to ground. Another inductor 224 may be coupled to one of end of inductor 220 and one end of JJ 222. The other end of inductor 224 may be coupled to an input of JTL element 278, which in turn may be coupled to the WBL_OUT terminal. The WWL may extend past memory circuit 200 via a coupling to the WWL_OUT terminal through JTL element 274. DFF 210 may further include a JTL element 218 to provide an output of DFF 210. The output of DFF 210 may be a current, whose amount depends on a state of the DFF.

Still referring to FIG. 2, read SQUID 250 may include transformers 252 and 258. Read SQUID 250 may further include Josephson junction (JJ) 266 and Josephson junction (JJ) 268. Transformer 252 may include inductors 254 and 256 configured to couple the current output by DFF 210 to read SQUID 250. Transformer 258 may include inductors 260 and 261 to couple any signals received via the RWL (via the RWL_IN terminal) to read SQUID 250. In terms of the operation of read SQUID 250, when DFF 210 has a logic "0" state, then DFF 210 may not provide any current to read SQUID 250, which in turn may keep read SQUID 250 in a half-select state. On the other hand, when DFF 210 has a logic "1" state, then DFF 210 may provide some current to read SQUID 250. When the RWL has a read signal asserted on it, the current provided by DFF 210 when combined with the current from the read signal may put read SQUID 250 into a "voltage state." The sum of the two currents in read SQUID 250 is shown as a circular arrow. In any case, similar to as described with respect to FIG. 1, a sense amplifier coupled to read SQUID 250 may sense a state of memory circuit 200. In one example, the presence or absence of a current pulse, voltage, or another parameter, once amplified by the sense amplifier, may determine the state of memory cell 100 as logic '0' or logic '1'. As shown in FIG. 2, the RWL and the RBL are coupled via transmission lines and do not include any JTL elements; instead they are represented as transmission lines 282 and 284 respectively. Although FIG. 2 shows a certain number of components of memory circuit 200 arranged in a certain manner, there could be more or fewer number of components arranged differently.

In terms of the operation of memory circuit 200, DFF 210 may act as a storage circuit for storing a state of memory cell 100 and read SQUID 250 may act as a read circuit for reading out the state of memory cell 100. Additional details regarding the operation of memory circuit 200 are explained with the help of FIG. 3, which shows a timing diagram 300 corresponding to operations associated with memory circuit 200.

Figure 3:
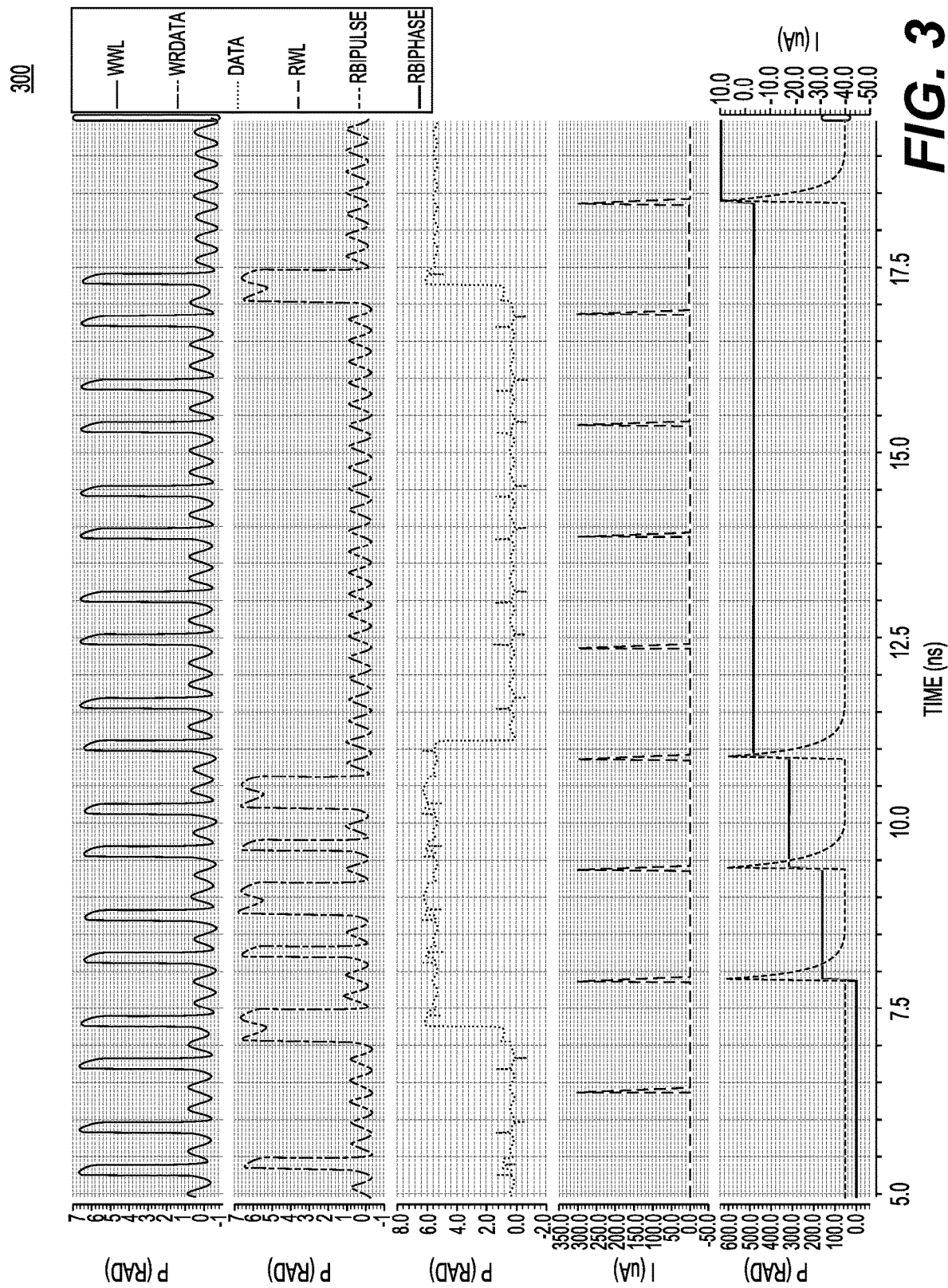
FIG. 3 shows a timing diagram corresponding to a memory cell in accordance with one example.

In this example, it is assumed that an initial state, represented by the data waveform, of DFF 210 is a logic "0" state. In this example, the rwl waveform corresponds to the signals (e.g., pulses) on the read word line (RWL). The WWL waveform corresponds to the signals (e.g., pulses) on the write word line (WWL). The rbipulse waveform corresponds to the pulses on the read bit line (RBL). The solid line that overlaps the rbipulse waveform corresponds to the phase advance on the read bit line (RBL). As shown in FIG. 3, in this example, when the rising edge on the WWL coincides with a logic "1" DATA state, then the state of DFF 210 changes from a logic "0" state to a logic "1" state. If DFF 210 is in a logic "1" state, then when a falling edge of WWL coincides with logic "0" DATA state, the state of DFF 210 changes from a logic "1" state to a logic "0" state. If the WWL and WBL signals are timed such that the WBL has a logic "0" when the pulse on the WWL rises and a logic "1" when the pulse on the WWL falls, the state of the memory remains unchanged. In addition, as shown in FIG. 3, in this example, when the pulse on the RWL arrives a state of DFF 210 is read out using read SQUID 250. When reading a logic "1" state, there is phase advance on the RBL (as shown by the rbiphase waveform); on the other hand, when reading a logic "0" state, there is no phase advance on the RBL. When reading a logic "1" from the DFF while the RWL is active the SQUID goes into a voltage state sending a voltage pulse up the RBL. This voltage pulse is often measured as an analog phase advance at the sense amp. In addition, in this example, as shown in FIG. 3, DFF 210 allows for writing of logic "1" and logic "0" values and also allows bit-enabled "non-writes." In this example, writes to DFF 210 happen on the rising or falling edges of the WWL signal. If the WBL has a logic "1" signal on it when the WWL rises, DFF 210 is written to a logic "1" state. If the WBL has a logic "0" signal on it when the WWL falls, DFF 210 is written into a logic "0" state. If the WBL has a logic "0" signal when the WWL rises and a logic "1" when the WWL falls, the state of DFF 210 is maintained.

Figure 4:
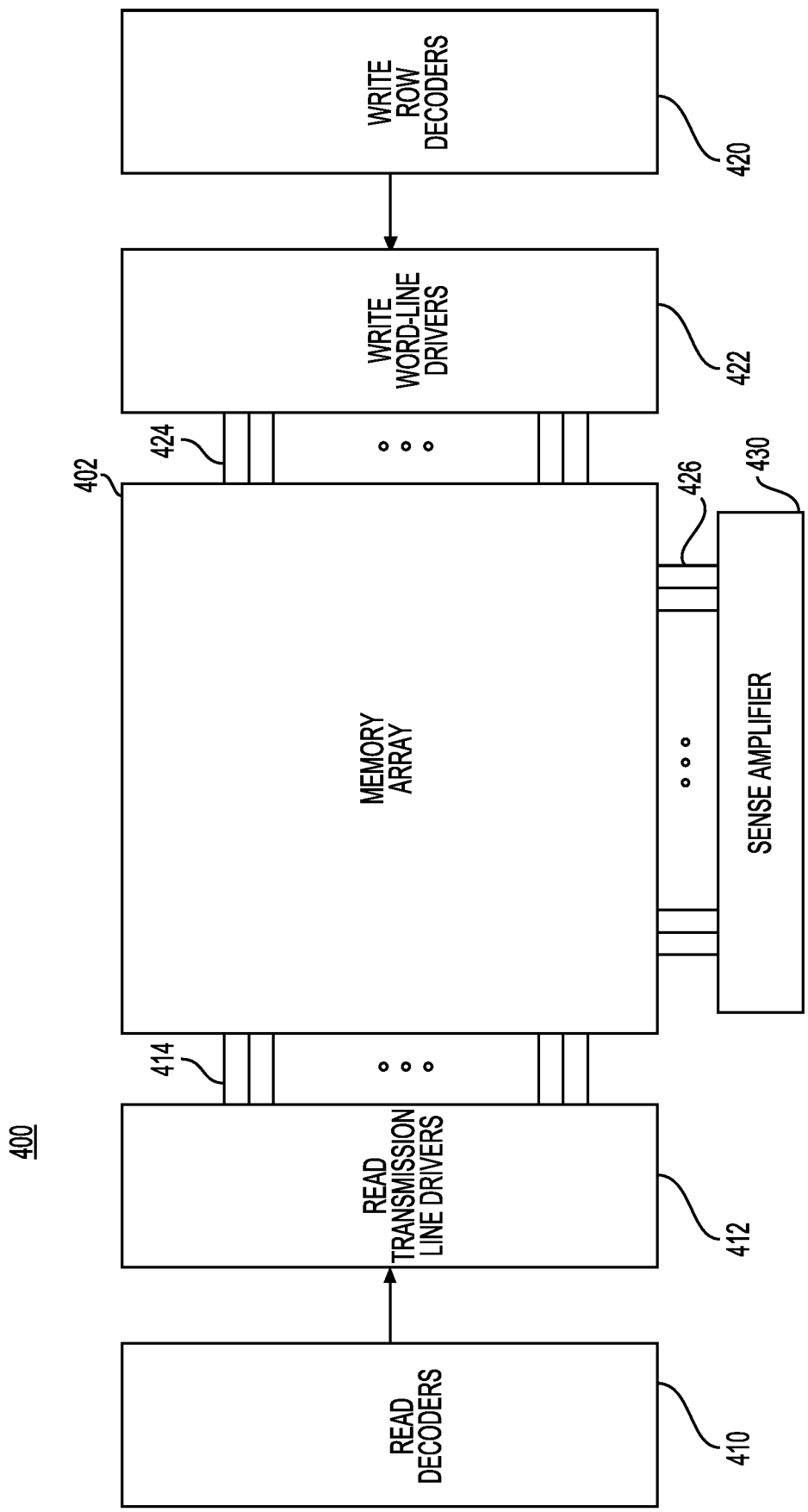
FIG. 4 shows a memory system with the memory cells of FIG. 1 and FIG. 2 in accordance with one example.

FIG. 4 shows a diagram of a memory system 400 in accordance with one example. Memory system 400 may include a memory array 402 of memory cells (e.g., memory cell 100) arranged in rows and columns. Memory system 400 may further include a row decoder 410 that may be configured to decode row control/address signals. Row decoder 410 may further be coupled to word-line drivers 412. Word-line drivers 412 may include circuitry to provide word-line read/write current to a subset or all of the memory cells associated with a selected word-line for any read or write operations. Word-line drivers 412 may provide such current via word-lines 414. Word-lines 414 may include both read word-lines and write word-lines. In other words, different word-lines may be used to provide current to the selected memory cells for read or write operations.

Memory system 100 may further include column decoder 420 that may be configured to decode column control/address signals. Column decoder 420 may further be coupled to bit-line drivers 422. Bit-line drivers 422 may include circuitry to provide bit-line read current to a subset or all of the memory cells associated with a selected bit-line for any read or write operations. Bit-line drivers 422 may provide such current via bit-lines 424. Bit-lines 424 may include both read bit-lines and write bit-lines. In other words, different bit-lines may be used to provide current to the selected memory cells for read or write operations. By using row and column addresses, any of the memory cells could be accessed using an address. Each of the bit-lines (e.g., bit-lines 424) may further be coupled to, via signal lines 426, sense amplifier 430 for sensing bit-lines to determine the logical state of selected memory cells. The coupling between memory array 402 of memory cells and sense amplifier 430 may include radio frequency (RF) transmission lines. The memory cells in each column may be serially current-biased by a common current source (e.g., a flux pump). As described earlier, bit-lines 424 may be used to couple this current to each of the memory cells in a column. As described with respect to FIG. 2, sense amplifier 430 may measure the bit-line current or the bit-line voltage to determine a state of a memory cell. Although FIG. 4 shows a certain number of components of memory system 400 arranged in a certain manner, there could be more or fewer number of components arranged differently.

Figure 5:
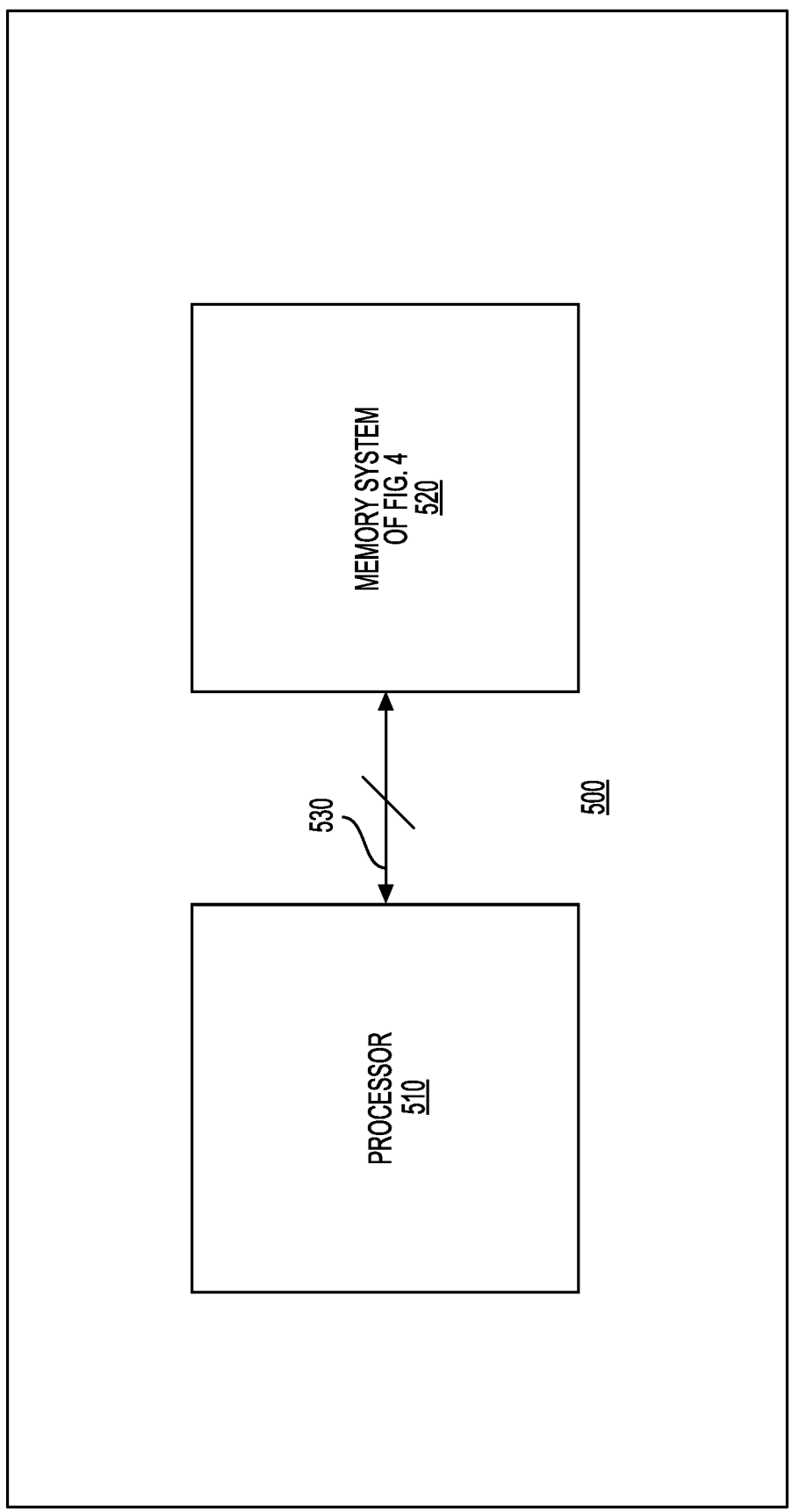
FIG. 5 shows a computing system including a memory, coupled to a processor, in accordance with one example.

FIG. 5 shows a computing system 500 including a processor 510 coupled to a memory 520 via bus 530 in accordance with one example. Processor 510 may perform read or write operations on memory 520. Additionally, processor 510 and memory 520 may be used along with other superconducting logic-based devices. In general, any superconducting device operating in cryogenic environments and requiring storage of instructions or data may include memory 520. Furthermore, processor 510 need not be in a cryogenic environment; instead, it may operate at non-cryogenic temperatures. In this example, memory 520 may be in a separate cryogenic environment and may be coupled via connectors to processor 510 in a way that the cryogenic environment can be maintained. Memory 520 may be used as part of storage in a data center for delivering cloud-based services, such as software as a service, platform as a service, or other services. Memory system 520 may include an array of memory cells (e.g., memory cell 100) arranged in rows and columns. Although FIG. 5 shows a certain number of components of computing system 500 arranged in a certain manner, there could be more or fewer number of components arranged differently.

Figure 6:
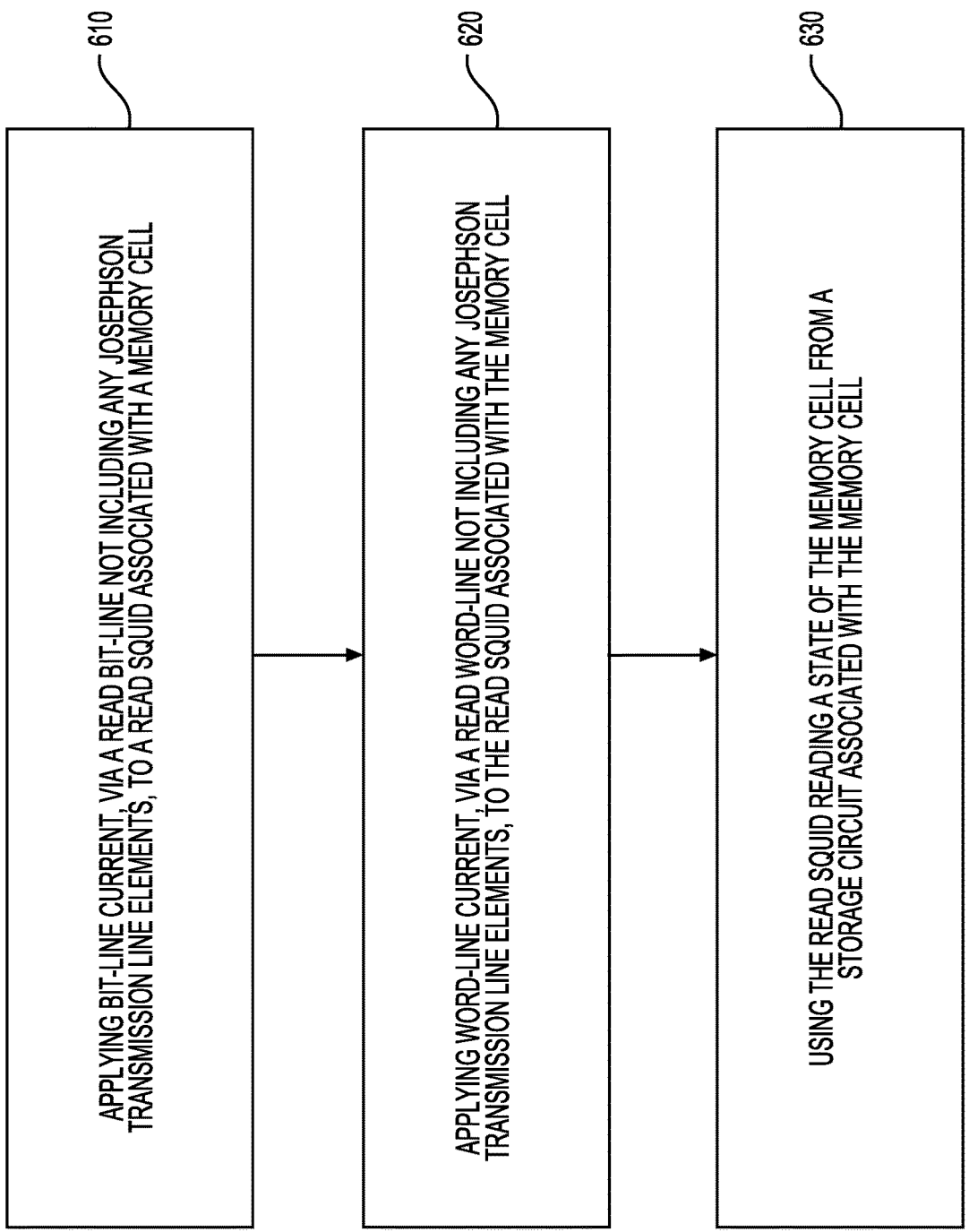
FIG. 6 shows a flow diagram for a method related to a memory system in accordance with one example.

In accordance with one example, FIG. 6 shows a flow chart corresponding to a method associated with memory cell 100. Step 610 may include applying bit-line current, via a read bit-line not including any Josephson transmission line elements, to a read SQUID associated with the memory cell. The read SQUID may be 104 of FIG. 1, which may be implemented as read SQUID 250 of FIG. 2. As explained earlier, a bit-line driver may be used to provide the bit-line current. The bit-line driver may be configured to provide current to the bit line (e.g., the RBL of FIG. 1 or the RBL of FIG. 2).

Step 620 may include applying word-line current, via a read word-line not including any Josephson transmission line elements, to a read SQUID associated with the memory cell. As explained earlier, a word-line driver may be used to provide word-line current.

Step 630 may include using the read SQUID reading a state of the memory cell from a storage circuit associated with the memory cell. The storage circuit may be storage circuit 102, which may be implemented as DFF 210 of FIG. 2. Although FIG. 6 shows the steps being performed in a certain order, at least one of the steps may be performed in a different order. In addition, fewer or additional steps may be performed. Moreover, steps 610 and 620 may be performed simultaneously.

In conclusion, the present disclosure describes a memory system including an array of memory cells arranged in rows and columns. The memory system may further include a set of read word-lines coupled to a plurality of memory cells in the array of the memory cells, wherein each of the set of the read word-lines comprises a line not including any Josephson transmission line (JTL) elements. The memory system may further include a set of write word-lines coupled to the plurality of memory cells in the array of memory cells, wherein each of the set of the write word-lines comprises a line including at least one Josephson transmission line (JTL) element.

Each of the memory plurality of memory cells may include at least one storage circuit and at least one read superconducting quantum interference device (SQUID), wherein the at least one storage circuit is configured to maintain a state of the memory cell, and wherein the at least one read SQUID is configured to read the state of the memory cell in response to an application of word-line current provided via a read word-line corresponding to the set of read word-lines.

The at least one storage circuit may comprise a differential flip-flop (DFF). The at least one read SQUID may comprise a first Josephson junction (JJ), a second Josephson junction (JJ), a first transformer coupled to the at least one storage circuit and a second transformer coupled to the read word-line.

The at least one storage circuit may be configured to be in a first state or a second state, and wherein the first state corresponds to a logic one state of the memory cell and the second state corresponds to a logic zero state of the memory cell. The DFF may be configured to provide a first current to the at least one read SQUID when the memory cell is in a logic one state and provide a second current to the at least one read SQUID when the memory cell is in a logic zero state, wherein an amount of the first current is higher than an amount of the second current.

The at least one read SQUID may be configured to be in a half-select state: (1) when the first current is provided to the at least one read SQUID by the DFF and no word-line current is provided to the at least one read SQUID by the read word-line or (2) when the second current is provided to the at least one read SQUID and the word-line current is provided to the at least one read SQUID by the read word-line. The at least one read SQUID may be configured to be in a full-select state when the first current is provided to the at least one read SQUID by the DFF and the word-line current is provided to the at least one read SQUID by the read word-line. The at least one read SQUID may be configured to be in a non-select state when the second current is provided to the at least one read SQUID by the DFF and no word-line current is provided to the at least one read SQUID by the read word-line.

In another example, a method in a memory system comprising a memory cell including at least one storage circuit and at least one read SQUID is provided. The method may include applying bit-line current, via a read bit-line not including any Josephson transmission line (JTL) elements, to the at least one read SQUID. The method may further include applying word-line current, via a read word-line not including any JTL elements, to the at least one read SQUID. The method may further include using the at least one read SQUID reading a logic state of the memory cell based on data maintained in the storage circuit.

The at least one read SQUID may comprise a first Josephson junction (JJ) and a second Josephson junction (JJ), a first transformer coupled to the at least one storage circuit and a second transformer coupled to the read word-line.

The at least one storage circuit may comprise a differential flip-flop (DFF). The at least one storage circuit may be configured to be in a first state or a second state, and wherein the first state corresponds to a logic one state of the memory cell and the second state corresponds to a logic zero state of the memory cell. The DFF may be configured to provide a first current to the at least one read SQUID when the memory cell is in a logic one state and provide a second current to the at least one SQUID when the memory cell is in a logic zero state.

The at least one read SQUID may be configured to be in a half-select state: (1) when the first current is provided to the at least one read SQUID by the DFF and no word-line current is provided to the at least one read SQUID by the read word-line or (2) when the second current is provided to the at least one read SQUID by the DFF and the word-line current is provided to the at least one read SQUID by the read word-line. The at least one read SQUID may be configured to be in a full-select state when the first current is provided to the at least one read SQUID by the DFF and the word-line current is provided to the at least one read SQUID by the read word-line. The at least one read SQUID may be configured to be in a non-select state when the second current is provided to the at least one read SQUID by the DFF and no word-line current is provided to the at least one read SQUID by the read word-line.

In another example, a memory system including an array of memory cells arranged in rows and columns is provided. The memory system may further include a set of read word-lines coupled to a plurality of memory cells in the array of the memory cells, wherein each of the set of the read word-lines comprises a line not including any Josephson transmission line (JTL) elements. The memory system may further include a set of write word-lines coupled to the first plurality of memory cells in the array of memory cells, wherein each of the set of the write word-lines comprises a line including at least one Josephson transmission line (JTL) element.

Each of the plurality of memory cells may include at least one differential flip-flop (DFF) and at least one read superconducting quantum interference device (SQUID), wherein the at least one read SQUID is configured to read the data stored in the at least one DFF in response to an application of word-line current via one of the set of read word-lines. The DFF may be configured to be in a first state or a second state, and wherein the first state corresponds to a logic one state of a memory cell and the second state corresponds to a logic zero state of the memory cell. The DFF may be configured to provide a first current to the at least one read SQUID when the memory cell is in a logic one state and provide a second current to the at least one SQUID when the memory cell is in a logic zero state, wherein an amount of the first current is higher than an amount of the second current.

The at least one read SQUID may comprise a first Josephson junction (JJ) and a second Josephson junction (JJ), a first transformer coupled to the at least one storage circuit and a second transformer coupled to the read word-line. The at least one read SQUID may be configured to be in a half-select state: (1) when the first current is provided to the at least one read SQUID by the DFF and no word-line current is provided to the at least one read SQUID by the read word-line or (2) when the second current is provided to the at least one read SQUID by the DFF and the word-line current is provided to the at least one read SQUID by the read word-line. The read at least one SQUID may be configured to be in a full-select state when the first current is provided to the at least one read SQUID by the DFF and the word-line current is provided to the at least one read SQUID by the read word-line. The at least one read SQUID may be configured to be in a non-select state when the second current is provided to the at least one read SQUID by the DFF and no word-line current is provided to the at least one read SQUID by the read word-line.

It is to be understood that the methods, modules, and components depicted herein are merely exemplary. Alternatively, or in addition, the functionality described herein can be performed, at least in part, by one or more hardware logic components. For example, and without limitation, illustrative types of hardware logic components that can be used include Field-Programmable Gate Arrays (FPGAs), Application-Specific Integrated Circuits (ASICs), Application-Specific Standard Products (ASSPs), System-on-a-Chip systems (SOCs), Complex Programmable Logic Devices (CPLDs), etc. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or inter-medial components. Likewise, any two components so associated can also be viewed as being "operably connected," or "coupled," to each other to achieve the desired functionality.

The functionality associated with the examples described in this disclosure can also include instructions stored in a non-transitory media. The term "non-transitory media" as used herein refers to any media storing data and/or instructions that cause a machine, such as processor 510, to operate in a specific manner. Exemplary non-transitory media include non-volatile media and/or volatile media. Non-volatile media include, for example, a hard disk, a solid state drive, a magnetic disk or tape, an optical disk or tape, a flash memory, an EPROM, NVRAM, PRAM, or other such media, or networked versions of such media. Volatile media include, for example, dynamic memory, such as, DRAM, SRAM, a cache, or other such media. Non-transitory media is distinct from, but can be used in conjunction with transmission media. Transmission media is used for transferring data and/or instruction to or from a machine. Exemplary transmission media, include coaxial cables, fiber-optic cables, copper wires, and wireless media, such as radio waves.

Furthermore, those skilled in the art will recognize that boundaries between the functionality of the above described operations are merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the disclosure provides specific examples, various modifications and changes can be made without departing from the scope of the disclosure as set forth in the claims below. Accordingly, the specification and figures are to be regarded in an illustrative rather than a restrictive sense, and all such modifications are intended to be included within the scope of the present disclosure. Any benefits, advantages, or solutions to problems that are described herein with regard to a specific example are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed:

1. A memory system comprising:
   an array of memory cells arranged in rows and columns;
   a set of read word-lines coupled to a plurality of memory cells in the array of the memory cells;
   a set of read bit-lines coupled to the plurality of memory cells in the array of the memory cells; and
   a set of write word-lines coupled to the plurality of memory cells in the array of memory cells, wherein each of the set of the write word-lines comprises a line including at least one Josephson transmission line (JTL) element being clocked by a clock, and wherein each of the plurality of the memory cells comprises:
   at least one storage circuit and at least one read superconducting quantum interference device (SQUID), wherein a read bit-line corresponding to the set of read bit-lines is coupled to the at least one read SQUID and a read word-line corresponding to the set of the read word-lines is coupled to the at least one read SQUID, wherein neither the read bit-line nor the read word-line is coupled to the at least one read SQUID via a JTL, wherein the at least one storage circuit is configured to maintain a state of the memory cell, and wherein the at least one read SQUID is configured to read the state of the memory cell in response to an application of word-line current provided via the read word-line corresponding to the set of read word-lines, wherein the at least one storage circuit comprises a differential flip-flop (DFF), wherein the DFF is configured to provide a first current to the at least one read SQUID when the memory cell is in a logic one state and provide a second current to the at least one read SQUID when the memory cell is in a logic zero state, wherein an amount of the first current is higher than an amount of the second current, wherein signals on neither the read bit-line nor the read word-line are phase-aligned with respect to the at least one JTL element being clocked by the clock.

2. The memory system of claim 1, wherein the at least one read SQUID comprises a first Josephson junction (JJ), a second Josephson junction (JJ), a first transformer coupled to the at least one storage circuit and a second transformer coupled to the read word-line.

3. The memory system of claim 1, wherein the at least one read SQUID is configured to be in a half-select state: (1) when the first current is provided to the at least one read SQUID by the DFF and no word-line current is provided to the at least one read SQUID by the read word-line or (2) when the second current is provided to the at least one read SQUID and the word-line current is provided to the at least one read SQUID by the read word-line.

4. The memory system of claim 1, wherein the at least one read SQUID is configured to be in a full-select state when the first current is provided to the at least one read SQUID by the DFF and the word-line current is provided to the at least one read SQUID by the read word-line.

5. The memory system of claim 1 further comprising a row decoder coupled to a set of word-line drivers configured to provide current to each of the set of read-word lines and the set of write-word lines.

6. The memory system of claim 1 further comprising a column decoder coupled to a set of bit-line drivers configured to provide current to the set of read-bit lines.

7. A method in a memory system comprising a memory cell including at least one storage circuit and at least one read SQUID, the method comprising performing a read operation and a write operation:
   the read operation comprising: (1) applying bit-line current, via a read bit-line not including any Josephson transmission line (JTL) elements, to the at least one read SQUID; (2) applying word-line current, via a read word-line not including any JTL elements, to the at least one read SQUID; and (3) using the at least one read SQUID reading a logic state of the memory cell based on data maintained in the storage circuit, wherein the at least one storage circuit comprises a differential flip-flop (DFF), wherein the DFF is configured to provide a first current to the at least one read SQUID when the memory cell is in a logic one state and provide a second current to the at least one read SQUID when the memory cell is in a logic zero state, wherein an amount of the first current is higher than an amount of the second current and the write operation comprising: applying a word-line current to the memory cell via a write-word line comprising a JTL element clocked by a clock, and wherein signals on neither the read bit-line nor the read word-line are phase-aligned with respect to the at least one JTL element being clocked by the clock.

8. The method of claim 7, wherein the at least one read SQUID comprises a first Josephson junction (JJ) and a second Josephson junction (JJ), a first transformer coupled to the at least one storage circuit and a second transformer coupled to the read word-line.

9. The method of claim 7, wherein the at least one read SQUID is configured to be in a half-select state: (1) when the first current is provided to the at least one read SQUID by the DFF and no word-line current is provided to the at least one read SQUID by the read word-line or (2) when the second current is provided to the at least one read SQUID by the DFF and the word-line current is provided to the at least one read SQUID by the read word-line.

10. The method of claim 7, wherein the at least one read SQUID is configured to be in a full-select state when the first current is provided to the at least one read SQUID by the DFF and the word-line current is provided to the at least one read SQUID by the read word-line.

11. The method of claim 7, wherein the memory system further comprises a row decoder coupled to a word-line driver configured to provide current to the read-word line.

12. The method of claim 7, wherein the memory system further comprises a column decoder coupled to a bit-line driver configured to provide current to the read-bit line.

13. A memory system comprising:
an array of memory cells arranged in rows and columns;
a set of read word-lines coupled to a plurality of memory cells in the array of the memory cells;
a set of read bit-lines coupled to the plurality of memory cells in the array of the memory cells; and
a set of write word-lines coupled to the first plurality of memory cells in the array of memory cells, wherein each of the set of the write word-lines comprises a line including at least one Josephson transmission line (JTL) element being clocked by a clock, and wherein each of the plurality of the memory cells comprises:
at least one differential flip-flop (DFF) and at least one read superconducting quantum interference device (SQUID), wherein a read bit line corresponding to the set of read bit lines is coupled to the at least one read SQUID and a read word-line corresponding to the set of the read word-lines is coupled to the at least one read SQUID, wherein neither the read bit-line nor the read word-line is coupled to the at least one read SQUID via a JTL, wherein the at least one read SQUID is configured to read the data stored in the at least one DFF in response to an application of word-line current via one of the set of read word-lines, wherein the DFF is configured to provide a first current to the at least one read SQUID when the memory cell is in a logic one state and provide a second current to the at least one read SQUID when the memory cell is in a logic zero state, wherein an amount of the first current is higher than an amount of the second current, wherein signals on neither the read bit line nor the read word-line are phase-aligned with respect to the at least one JTL element being clocked by the clock.

14. The memory system of claim 13, wherein the at least one read SQUID comprises a first Josephson junction (JJ) and a second Josephson junction (JJ), a first transformer coupled to the at least one storage circuit and a second transformer coupled to the read word-line.

15. The memory system of claim 13, wherein the at least one read SQUID is configured to be in a half-select state: (1) when the first current is provided to the at least one read SQUID by the DFF and no word-line current is provided to the at least one read SQUID by the read word-line or (2) when the second current is provided to the at least one read SQUID by the DFF and the word-line current is provided to the at least one read SQUID by the read word-line.

16. The memory system of claim 13, wherein the read at least one SQUID is configured to be in a full-select state when the first current is provided to the at least one read SQUID by the DFF and the word-line current is provided to the at least one read SQUID by the read word-line.

17. The memory system of claim 13 further comprising a row decoder coupled to a set of word-line drivers configured to provide current to each of the set of read-word lines and the set of write-word lines.

18. The memory system of claim 13 further comprising a column decoder coupled to a set of bit-line drivers configured to provide current to the set of read-bit lines.

* * * * *